US009031510B2

(12) United States Patent
Oda

(10) Patent No.: US 9,031,510 B2
(45) Date of Patent: May 12, 2015

(54) CONTROL APPARATUS OF CAPACITIVE TOUCH SENSOR

(71) Applicant: DENSO CORPORATION, Kariya, Aichi-pref. (JP)

(72) Inventor: Yuusuke Oda, Gamagori (JP)

(73) Assignee: DENSO CORPORATION, Kariya (JP)

( * ) Notice: Subject to any disclaimer, the term of this patent is extended or adjusted under 35 U.S.C. 154(b) by 247 days.

(21) Appl. No.: 13/716,417

(22) Filed: Dec. 17, 2012

(65) Prior Publication Data
US 2013/0171925 A1 Jul. 4, 2013

(30) Foreign Application Priority Data
Dec. 19, 2011 (JP) ................................. 2011-277167

(51) Int. Cl.
H04B 1/00 (2006.01)
H04B 1/10 (2006.01)
H04B 15/06 (2006.01)
H03K 17/96 (2006.01)

(52) U.S. Cl.
CPC ................. H04B 1/10 (2013.01); H04B 15/06 (2013.01); H03K 17/962 (2013.01); H03K 2017/9606 (2013.01); H03K 2217/960705 (2013.01)

(58) Field of Classification Search
USPC ................ 455/3.01–3.05, 63.3, 71, 113, 131, 455/182.1, 192.1, 275, 313
See application file for complete search history.

(56) References Cited

U.S. PATENT DOCUMENTS

| 5,757,195 | A | * | 5/1998 | Bird ............................... 324/678 |
| 6,466,036 | B1 | | 10/2002 | Philipp |
| 7,312,616 | B2 | | 12/2007 | Snyder |
| 8,730,194 | B2 | * | 5/2014 | Vellanki ......................... 345/173 |
| 2003/0080755 | A1 | | 5/2003 | Kobayashi |
| 2004/0031329 | A1 | * | 2/2004 | Carpenter et al. .......... 73/861.19 |
| 2005/0212532 | A1 | * | 9/2005 | Bernhard ....................... 324/664 |
| 2006/0144995 | A1 | * | 7/2006 | Clancy .......................... 244/99.2 |
| 2007/0279229 | A1 | * | 12/2007 | Shaffer et al. ............... 340/572.1 |
| 2008/0252303 | A1 | | 10/2008 | Kato et al. |
| 2009/0240695 | A1 | * | 9/2009 | Angell et al. ..................... 707/7 |
| 2010/0066137 | A1 | * | 3/2010 | Sakai et al. ................. 297/217.3 |
| 2010/0100026 | A1 | * | 4/2010 | Morris ......................... 604/5.04 |
| 2011/0012623 | A1 | * | 1/2011 | Gastel et al. .................. 324/686 |
| 2011/0012624 | A1 | * | 1/2011 | Gastel et al. .................. 324/686 |
| 2011/0223877 | A1 | * | 9/2011 | Tillman et al. ............. 455/226.2 |

(Continued)

FOREIGN PATENT DOCUMENTS

JP 2003-202383 A 7/2003
JP 2005-293487 A 10/2005

(Continued)

*Primary Examiner* — Dominic E Rego
(74) *Attorney, Agent, or Firm* — Posz Law Group, PLC

(57) ABSTRACT

A control apparatus of a capacitive touch sensor includes a capacitive sensor, a radio receiver, a setting unit, and a charge control unit. The capacitive sensor is coupled to a manipulation panel and detects an approach of a finger of a user to the manipulation panel and a touch of the finger on the manipulation panel. The radio receiver receives a radio broadcast at a radio receiving frequency. The setting unit sets a sensing frequency to a selected value, which is determined from a plurality of selectable sensing frequency values, corresponding to the radio receiving frequency. The charge control unit is coupled to a switching unit, and controls the switching unit to operate at the sensing frequency in order to charge and discharge an electrostatic capacitance generated between the capacitive sensor and the finger.

11 Claims, 13 Drawing Sheets

(56) References Cited

U.S. PATENT DOCUMENTS

2012/0033651 A1* 2/2012 Dinan ............................ 370/336
2012/0150467 A1* 6/2012 Tasher et al. .................... 702/65
2012/0242354 A1* 9/2012 Cors et al. ...................... 324/672
2012/0303476 A1* 11/2012 Krzyzanowski et al. .... 705/26.5
2013/0076690 A1* 3/2013 Vellanki ......................... 345/174

FOREIGN PATENT DOCUMENTS

| JP | 2006-303975 A | 11/2006 |
|----|---------------|---------|
| JP | 2009177677 A | 8/2009 |
| JP | 2010272991 A | 12/2010 |

* cited by examiner

FIG. 15

| TIME | SUN | MON | TUE | WED | THU | FRI | SAT |
|---|---|---|---|---|---|---|---|
| 6:00<br>6:30<br>7:30 | | CH B ↕<br>✕<br>CH A ↕ | CH B ↕<br>✕<br>CH A ↕ | CH B ↕ | | | |
| 12:00<br>15:00 | CH A ↕ | | | | | | |
| 19:00<br>20:00 | | CH C ↕ | CH C ↕ | CH C ↕ | CH C ↕ | CH C ↕ | |

CONTROL APPARATUS OF CAPACITIVE TOUCH SENSOR

CROSS REFERENCE TO RELATED APPLICATION

This application is based on Japanese Patent Application No. 2011-277167 filed on Dec. 19, 2011, the disclosure of which is incorporated herein by reference.

TECHNICAL FIELD

The present disclosure relates to a control apparatus of a capacitive touch sensor.

BACKGROUND

U.S. Pat. No. 6,466,036 B1 discloses an art related to a capacitive touch sensor that includes a charge transfer capacitance measurement circuit. In this capacitive touch sensor, when a sense plate is touched by a finger, an electrostatic capacitance is generated between an electrode, which is disposed in an internal portion of the sense plate, and the finger. Then, the electrostatic capacitance is charged to sense the touch of the finger by detecting an amount of an electric charge accumulated between the electrode and the finger.

U.S. Pat. No. 7,312,616 B2 discloses a method of detecting an electrostatic capacitance. In U.S. Pat. No. 7,312,616 B2, the electrostatic capacitance is detected by a successive approximate capacitance measurement circuit. Specifically, a storage capacitor is pre-charged to a predetermined electric potential. When a sensor is touched by a finger, an electrostatic capacitance is generated between an electrode, which is disposed in an internal portion of the sensor, and the finger. The electrostatic capacitance is repeatedly charged and discharged at a predetermined time period so that a predetermined charge current is approximately output from a current source and the storage capacitor.

In U.S. Pat. No. 7,312,616 B2, with above-described configuration, the electric potential of the storage capacitor decreases, and a charge time to reset the electric potential of the storage capacitor to the predetermined electric potential changes. The charge time changes depending on the charge current. Further, the charge current changes depending on the electrostatic capacitance generated between the electrode and the finger. Thus, a touch on the sensor is detected by measuring a change of the charge time.

As described above, the electrostatic capacitance is detected by repeatedly performing a charge and a discharge to the electrostatic capacitance. Thus, a switching circuit is necessary to repeatedly perform the charge and the discharge. When the switching circuit controls switching elements to repeatedly open and close to perform the charge and the discharge, a radiation noise is generated from the switching circuit. Since, the radiation noise is generated during a switching operation of the switching circuit, the radiation noise is also referred to as a switching noise. A frequency of the switching circuit to perform the charge and the discharge generally has a range of several dozen kilohertz (kHz) to several hundred kHz.

In order to reduce the radiation noise, JP 2010-272991 A discloses a method of reducing the radiation noise by adding a detection electrode. Further, JP 2009-177677 A discloses a method of reducing the radiation noise using a spread-spectrum technique. Specifically, a peak radiation noise level is reduced by randomly changing a frequency of a pulse signal to spread a spectrum of the radiation noise.

A noise reduction effect of the spread-spectrum technique depends on a band width of a spread frequency band. Thus, the spread-spectrum technique has a limited noise reduction effect. Further, when the frequency is spread, a harmonic noise is distributed in a wide range. Thus, spread-spectrum technique fails to reduce the radiation noise radically.

SUMMARY

In view of the foregoing difficulties, it is an object of the present disclosure to provide a control apparatus of a capacitive touch sensor, which reduces an interference of a switching noise to a radio receiver.

According to an aspect of the present disclosure, a control apparatus of a capacitive touch sensor includes a capacitive sensor, a radio receiver, a setting unit, and a charge control unit. The capacitive sensor is coupled to a manipulation panel and detects an approach of a finger of a user to the manipulation panel and a touch of the finger on the manipulation panel. The radio receiver receives a radio broadcast at a radio receiving frequency. The setting unit sets a sensing frequency to a selected value, which is determined from a plurality of selectable sensing frequency values, corresponding to the radio receiving frequency. The charge control unit is coupled to a switching unit, and controls the switching unit to operate at the sensing frequency in order to charge and discharge an electrostatic capacitance generated between the capacitive sensor and the finger.

In the above apparatus, an interference of a switching noise, which is generated during a switching operation of the switching unit, to the radio receiver is reduced.

BRIEF DESCRIPTION OF THE DRAWINGS

The above and other objects, features and advantages of the present disclosure will become more apparent from the following detailed description made with reference to the accompanying drawings. In the drawings:

FIG. 15 is a diagram showing an example of selected radio receiving frequency and selected time slot stored in a storage.

DETAILED DESCRIPTION (First Embodiment)

The following will describe a first embodiment of a control apparatus 1 of a capacitive touch sensor with reference to FIG. 1 to FIG. 10. In the present disclosure, the control apparatus 1 of the capacitive touch sensor is equipped to a navigation device, which is placed in a vehicle.

Figure 1:
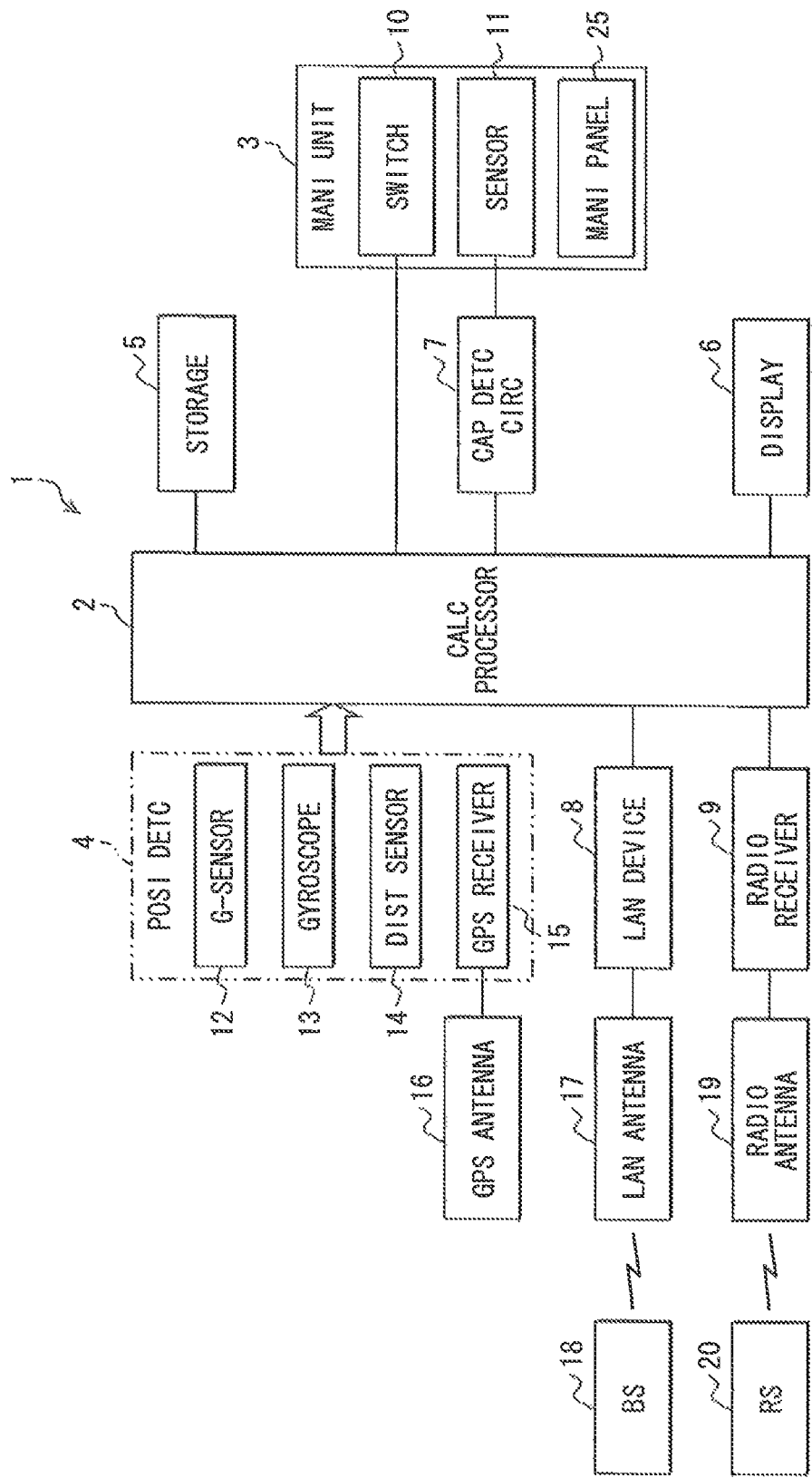
FIG. 1 is a block diagram showing a configuration of a control apparatus of a capacitive touch sensor according to a first embodiment of the present disclosure.

As shown in FIG. 1, the control apparatus 1 includes a calculation processor (CALC PROCESS) 2, a manipulation unit (MANI UNIT) 3, a position detector (POSI DETC) 4, a storage unit (STORAGE) 5, a display unit (DISPLAY) 6, a capacitance detection circuit (CAP DETC CIRC) 7, a wireless local area network (wireless LAN) device (LAN DEVICE) 8, and a radio receiver (RADIO RECEIVER) 9. The manipulation unit 3 includes a mechanical switch unit (SWITCH) 10, a capacitive sensor (SENSOR) 11, and a manipulation panel (MANI PANEL) 25. The manipulation unit 3 outputs a signal corresponding to a manipulation performed by a user on the manipulation panel 25. The signal is generated by the mechanical switch unit 10 or the capacitive sensor 11 when the mechanical switch unit 10 or the capacitive sensor 11 detects the manipulation performed by the user. In the manipulation unit 3, the capacitive sensor 11 is a capacitive touch sensor that detects the manipulation performed by the user on the manipulation panel 25.

The calculation processor 2 includes a central processing unit (CPU) that executes control programs in order to control an operation of the control apparatus 1. The position detector 4 includes one or more sensors including an accelerometer 12, a gyroscope 13, a distance sensor (DIST SENSOR) 14, and a global positioning system (GPS) receiver 15. The accelerometer 12 is also referred to as a G-sensor. The GPS receiver 15 includes a GPS antenna 16, which receives GPS signals. The G-sensor 12, the gyroscope 13, the distance sensor 14, and the GPS receiver 15 have detection errors, respectively.

The calculation processor 2 specifies a present position of a vehicle to which the control apparatus 1 is equipped based on signals output from the G-sensor 12, the gyroscope 13, the distance sensor 14, and the GPS receiver 15 in an interpolated manner. Hereinafter, the vehicle to which the control apparatus 1 is equipped is also referred to as a subject vehicle. When a detection accuracy of a present position of the subject vehicle satisfies a required level, the position detector 4 may include a part of the sensors other than all of the sensors described above. The position detector 4 may further include a steering sensor that detects a steering angle of a steering wheel and a wheel sensor that detects a rotation of a wheel of the subject vehicle.

The storage unit 5 that stores information is provided by a volatile memory, a non-volatile memory, a solid-state drive (SSD), a hard disk drive (HDD), and the like. The display unit 6 is provided by a liquid crystal display (LCD), an organic electro-luminescence display, a plasma display, and the like.

The wireless LAN device 8 includes a wireless LAN antenna 17 to communicate with a base station (BS) 18. For example, the wireless LAN device 8 may perform a wireless communication based on WiFi (registered trademark) standard. The wireless LAN device 8 acquires external information via the base station 18 and receives position information of the base station 18. The radio receiver 9 is coupled to a radio antenna 19. The radio receiver 9, via the radio antenna 19, receives a radio wave, which is also known as a radio broadcast or a radio channel. For example, the radio antenna 19 receives an amplitude modulation (AM) radio broadcast, which uses a medium frequency radio band. The capacitance detection circuit 7 is coupled to the capacitive sensor 11. The capacitance detection circuit 7 detects an electrostatic capacitance Cx generated between the capacitive sensor 11 and a finger 26 of the user based on an output signal from the capacitive sensor 11.

Figure 2:
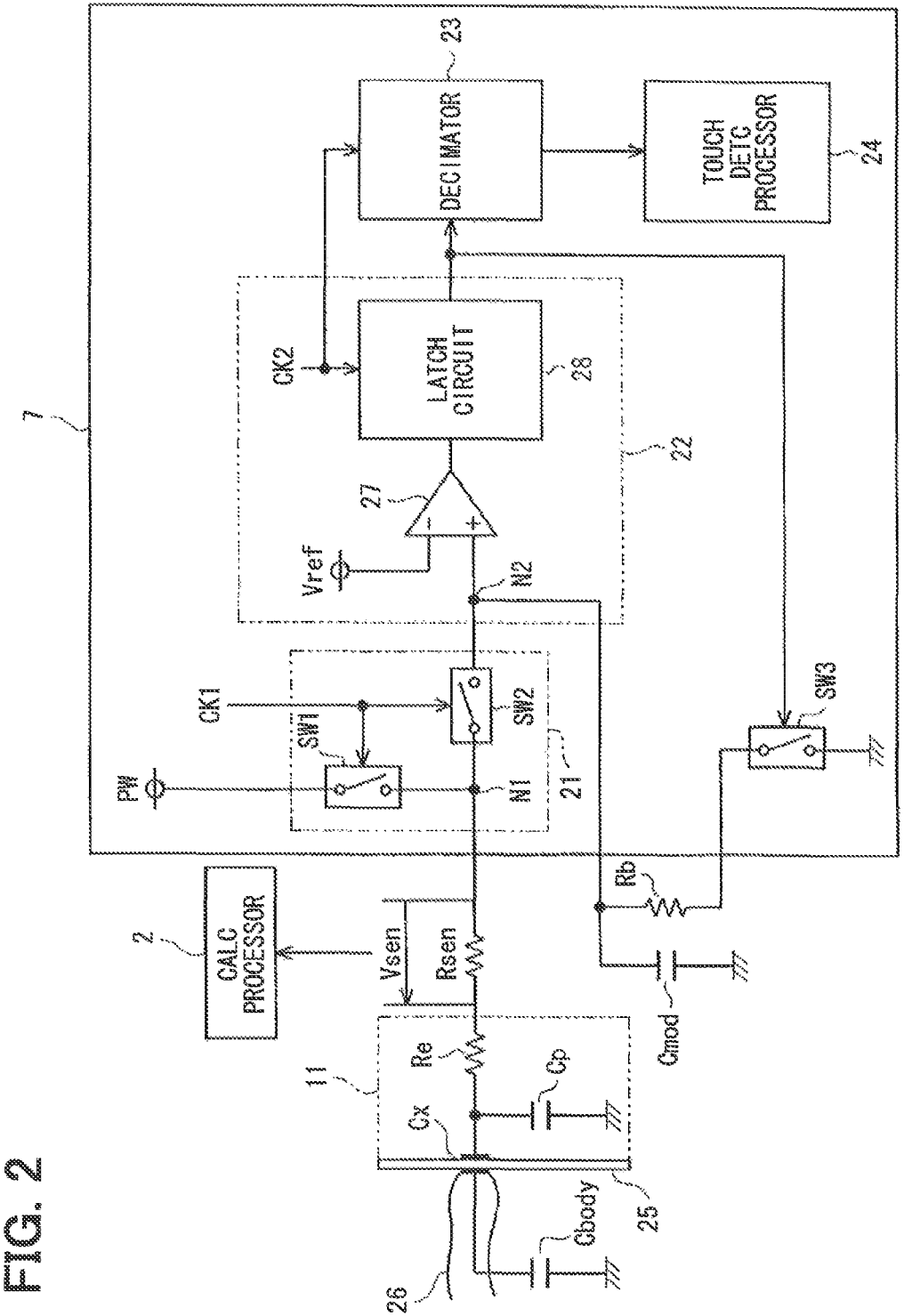
FIG. 2 is a block diagram showing a configuration of a capacitance detection circuit of an electrostatic capacitance according to the first embodiment.

FIG. 2 shows a configuration of the capacitance detection circuit 7 and an electric coupling between the capacitance detection circuit 7 and the capacitive sensor 11. The following will describe a principle based on which the capacitance detection circuit 7 detects the electrostatic capacitance Cx with reference to FIG. 2. The capacitive sensor 11 is also referred to as a capacitance touch switch. As shown in FIG. 2, the capacitive sensor 11 can be converted to an equal circuit in which a resistor Re and a parasitic capacitance Cp are coupled in series. The parasitic capacitance Cp is also known as a floating capacitance. When the finger 26 approaches to or touches on the manipulation panel 25, the electrostatic capacitance Cx is generated between the capacitive sensor 11 and the finger 26 via the manipulation panel 25. With this configuration, the capacitive sensor 11 detects a change of the electrostatic capacitance Cx based on an approach of the finger 26 to the manipulation panel 25 or a touch of the finger 26 on the manipulation panel 25.

The capacitance detection circuit 7 includes a switching unit 21, a pulse density modulation unit 22, a decimator 23, and a touch detection processor 24. The pulse density modulation unit 22 has a configuration of a well-known delta-sigma modulation unit.

The switching unit 21 includes a charge switch SW1 for switching to a charge state of the electrostatic capacitance Cx and a discharge switch SW2 for switching to a discharge state of the electrostatic capacitance Cx. The charge switch SW1 and the discharge switch SW2 are coupled to each other as shown in FIG. 2. The charge switch SW1 is coupled between a power source PW and a node N1 that is coupled to the capacitive sensor 11. Specifically, the charge switch SW1 is coupled between the power source PW and the node N1 that is coupled to the resistor Re of the equal circuit of the capacitive sensor 11. The power source PW may be provided by a voltage source or a current source. The discharge switch SW2 is coupled between the node N1 and a node N2. The node N1 is also a common coupling node of the charge switch SW1 and a resistor Rsen. The node N2 is an input node of the pulse density modulation unit 22.

Each of the charge switch SW1 and the discharge switch SW2 has a control pole. Each of the charge switch SW1 and the discharge switch SW2 open and close in a complementary manner based on a first clock signal CK1 that is used for controlling the charge and the discharge. That is, when the charge switch SW1 is open, the discharge switch SW2 is closed, and when the charge switch SW1 is closed, the discharge switch SW2 is open. The first clock signal CK1 is provided by the calculation processor 2. When the charge switch SW1 is closed and the discharge switch SW2 is open, a charge current flows from the power source PW to the capacitive sensor 11 via the charge switch SW1 and the resistor Rsen. The resistor Rsen is also referred to as a sensing resistor Rsen.

When the charge switch SW1 is open and the discharge switch SW2 is closed, a discharge current flows from the capacitive sensor 11 to the node N2 via the floating capacitance Cp, the resistor Rsen, and the discharge switch SW2. The node N2 is coupled to a capacitor Cmod, which is charged by discharge current from the capacitive sensor 11 to the node N2. That is, when the switch SW2 is closed, an electric charge that is discharged from the capacitive sensor 11 is charged to the capacitor Cmod.

The resistor Rsen is coupled between the switching unit 21 of the capacitance detection circuit 7 and the capacitive sensor 11. A voltage signal Vsen across terminals of the resistor Rsen is transmitted to the calculation processor 2. The calculation processor 2 detects the charge current, the discharge current, a charge voltage, and a discharge voltage based on the voltage signal Vsen.

The pulse density modulation unit 22 includes a comparator 27 and a latch circuit 28, which are coupled in a manner shown in FIG. 2. The node N2 functions as the input node N2 of the pulse density modulation unit 22. The comparator 27 has a configuration of a one-bit quantizer. The comparator 27 compares a voltage of the input node N2 with a reference voltage Vref. Hereinafter, the voltage of the input node N2 is also referred to as an input node voltage. When the input node voltage is higher than the reference voltage Vref, the comparator 27 outputs a comparison output having a high level, and when the input node voltage is lower than the reference voltage Vref, the comparator 27 outputs a comparison output having a low level. The comparison output having the high level is also referred to as a high-level output H, and the comparison output having the low level is also referred to as a low-level output L.

The latch circuit 28 has a configuration of a delay line. The latch circuit 28 maintains the comparison output of the comparator 27, and modulates the comparison output of the comparator 27 based on a second clock signal CK2 that is used for the delta-sigma modulation of the comparison output of the comparator 27. The second clock signal CK2 is a one-bit high-frequency sampling signal, and is provided to the latch circuit 28 via a clock terminal (not shown) of the latch circuit 28. With this configuration, the comparison output of the comparator 27 is modulated based on the second clock signal CK2 in a pulse density modulation manner at a bit-rate of, for example, several dozen megahertz (MHz). The comparison output of the comparator 27, which is modulated by the latch circuit 28 is output to a control pole of a switch SW3. When an output period of the high-level output H is long, the number of switching operations of the switch SW3 between an open state and a closed state increases, and the discharge current flowing into a resistor Rb increases. When an output period of the low-level output L is long, the number of switching operations of the switch SW3 decreases, and the discharge current flowing into the resistor Rb decreases.

The decimator 23 converts the second clock signal CK2, which is the one-bit high-frequency sampling signal, to a multi-bit low-frequency sampling signal, and provides the multi-bit low-frequency sampling signal to the touch detection processor 24. The touch detection processor 24 determines whether the touch of the finger 26 on the manipulation panel 25 is performed based on the multi-bit low-frequency sampling signal. Further, the touch detection processor 24 detects a multi-touch input, a flick gesture based on the multi-bit low-frequency sampling signal.

The following will describe a control process of a sensing frequency fs so that a level of a harmonic noise of the sensing frequency fs is within a predetermined range. The sensing frequency fs is also known as a switching frequency of the switching unit 21 to charge and discharge the electrostatic capacitance Cx. During an operation of the capacitive sensor 11, a radiation noise generated in the switching unit 21 is superimposed to the radio antenna 19 equipped to the subject vehicle. The superimposed radiation noise is possibly audible to the user as a radio noise when the user uses the radio. Since, the radiation noise is generated during a switching operation of the switching unit 21, the radiation noise is also referred to as a switching noise hereinafter. When assume that a waveform of the charge current of the current capacitance detection circuit 7 and a waveform of the discharge current of the capacitance detection circuit 7 are rectangular waveforms, odd harmonic components of a base waveform of the charge current or the discharge current emerge as noise components.

Figure 3:
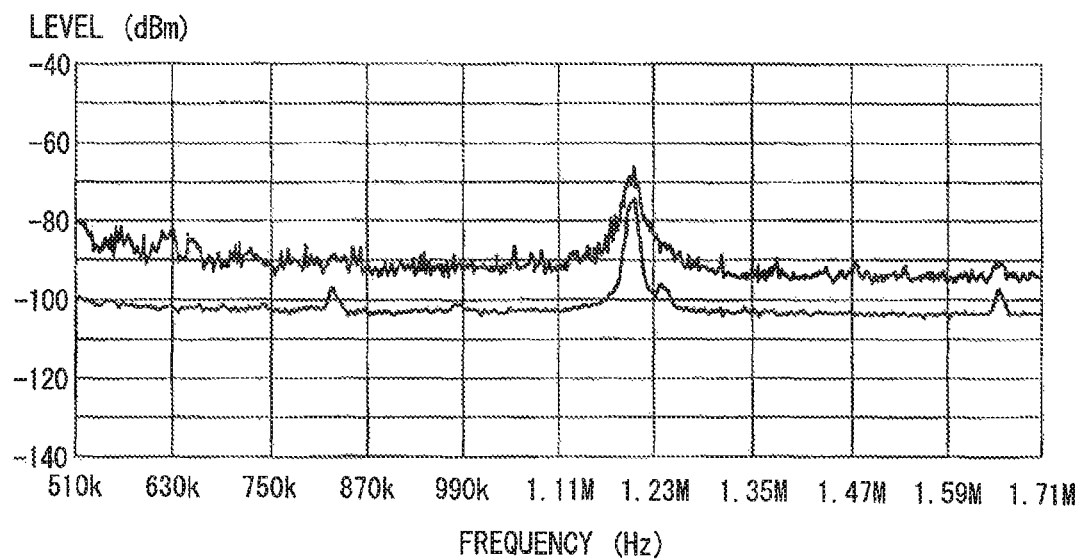
FIG. 3 is a diagram showing an exemplary spectrum of a harmonic noise of a sensing frequency when the sensing frequency is 400 kHz.
Figure 4:
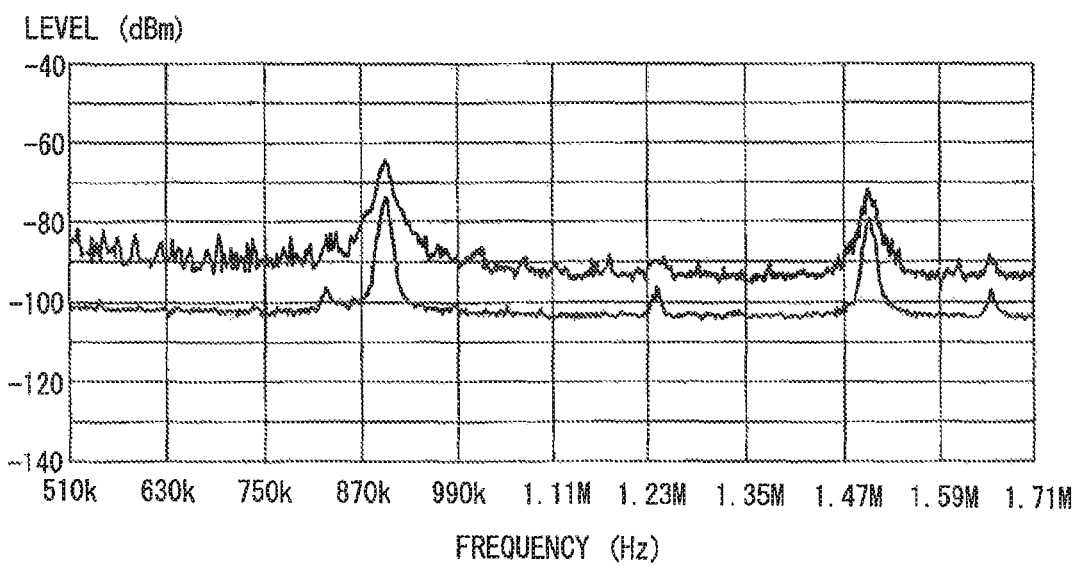
FIG. 4 is a diagram showing an exemplary spectrum of a harmonic noise of a sensing frequency when the sensing frequency is 300 kHz.

FIG. 3 shows a noise spectrum of a third harmonic component of the sensing frequency fs when the sensing frequency fs is 400 kHz. When the sensing frequency fs is 400 kHz, the third harmonic component having a frequency of 1200 kHz emerges within an AM radio band having a frequency range of 510 kHz to 1710 kHz. In this case, the third harmonic component of the sensing frequency fs becomes a harmonic noise, and may affect a radio receiving frequency fr of 1200 kHz. As shown in FIG. 4, when the sensing frequency fs is 300 kHz, a harmonic noise peak of the third harmonic component of the sensing frequency fs appears at 900 kHz, and a harmonic noise peak of a fifth harmonic component of the sensing frequency fs appears at 1500 kHz. Thus, the harmonic noise peaks of odd-number harmonic components of the sensing frequency fs are shifted from the radio receiving frequency fr of 1200 kHz, and the harmonic noise generated by the sensing frequency fs is reduced at the radio receiving frequency fr of 1200 kHz. FIG. 3 shows both a spectrum of the harmonic noise of the sensing frequency fs of 300 kHz, which is analyzed by a fast Fourier transform analysis method with a spectrum analyzer and a smoothened waveform of the spectrum of the harmonic noise of the sensing frequency fs. Similarly, FIG. 4 shows both a spectrum of the harmonic noise of the sensing frequency fs of 400 kHz, which is analyzed by a fast Fourier transform analysis method with a spectrum analyzer and a smoothened waveform of the spectrum of the harmonic noise of the sensing frequency fs.

The radiation noise changes with a change of the charge current or the discharge current of the capacitive sensor 11 and a change of a capacitance coupled to the capacitance detection circuit 7. For example, the capacitance may be a capacitance Cbody generated between an earth ground and a body of the user. Thus, the radiation noise is generated and increases when the user touches the capacitive sensor 11 even when a radio product itself has no noise related fault. It is difficult to design a circuit so that all of the frequencies included in a frequency band or a frequency group have sufficient margins to a manipulation on the manipulation panel 25 that is coupled to the capacitive sensor 11. Thus, the sensing frequency fs is controlled to switch based on an operation state of a radio circuit system in the present embodiment. Specifically, in the present embodiment, the sensing frequency is controlled to switch based on the radio receiving frequency fr of the radio circuit system.

Specifically, in the present embodiment, a field intensity level of a radio receiving frequency fr is measured by the radio antenna 19 and the radio receiver 9. Specifically, the field intensity level is measured during a non-operation state of the capacitance detection circuit 7 and during an operation state of the capacitance detection circuit 7. That is, the field intensity level is measured before the capacitance detection circuit 7 starts to operate and after the capacitance detection circuit 7 has started to operate. The field intensity level measured before the operation of the capacitance detection circuit 7 has a pre-operation value, and is also referred to as a pre-operation field intensity level. The field intensity level measured after the operation of the capacitance detection circuit 7 has a post-operation value, and is also referred to as a post-operation field intensity level. By comparing the pre-operation value and the post-operation value of the field intensity level, the noise component generated by the capacitance detection circuit 7 at a present sensing frequency fs is calculated. The present sensing frequency fs is controlled to change corresponding to the radio receiving frequency fr so that a difference between the pre-operation value and the post-operation value has a minimum value. Since each radio channel has a predetermined radio receiving frequency fr, the radio receiving frequency fr is also referred to as a radio channel.

Figure 5:
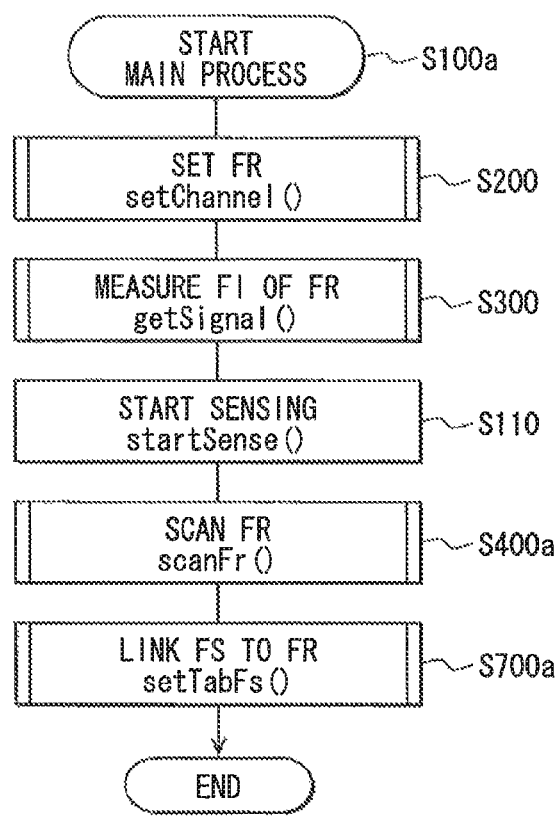
FIG. 5 is a flowchart showing a main process according to the first embodiment.
Figure 6:
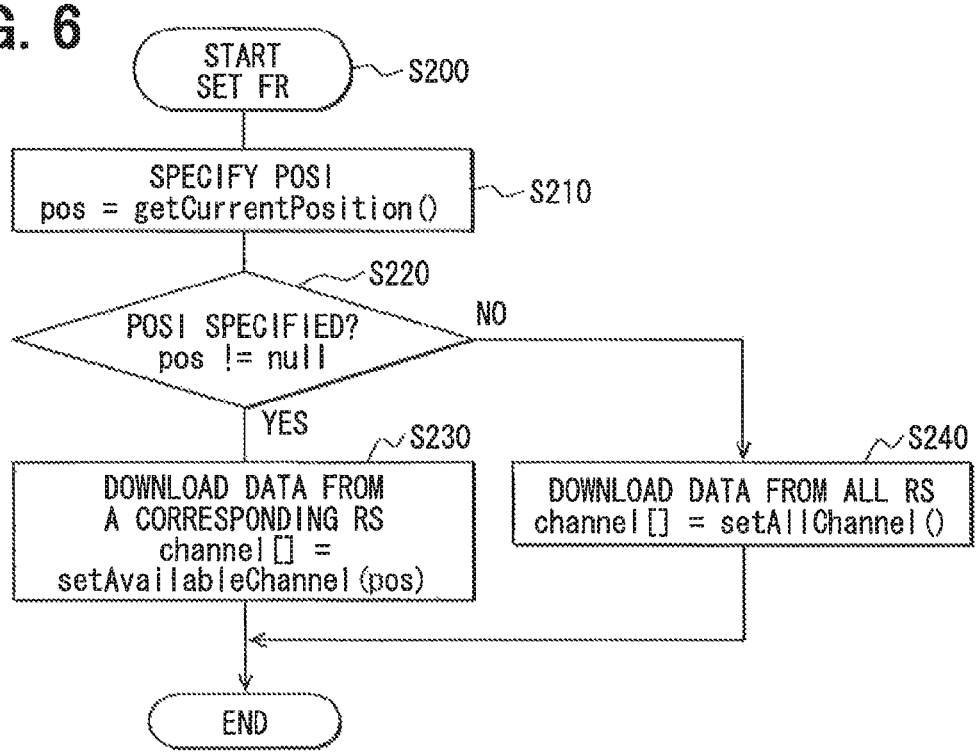
FIG. 6 is a flowchart showing a setting process of a radio receiving frequency according to the first embodiment.

The following will describe an operation of the control apparatus 1 according to the present embodiment with reference to FIG. 5 to FIG. 10. FIG. 5 shows a flowchart of a main process executed by the calculation processor 2 of the control apparatus 1 according to the present embodiment. At S100a, the main process starts. At S200, the calculation processor 2 sets a radio receiving frequency fr by executing a command setChannel( ). FIG. 6 shows a setting process of the radio receiving frequency fr in detail.

As shown in FIG. 6, at S210, the calculation processor 2 controls the position detector 4 to specify the present position of the subject vehicle by executing a command pos=getCurrentPosition( ). In this command, the pos indicates the present position of the subject vehicle. At S220, the calculation processor 2 determines whether the present position of the subject vehicle is successfully specified by executing a command pos !=null. When the calculation processor 2 determines that the present position of the subject vehicle is successfully specified (S220:YES), the calculation processor 2 downloads relative data of a radio station (RS) 20 from the storage unit by executing a command channel[ ]=setAvailableChannel(pos). In this case, the calculation processor downloads the relative data of the radio station, which is located within an area corresponding to the present position of the subject vehicle. The storage unit 5 preliminarily stores relative data of all of the radio stations 20 located within a whole country.

When the calculation processor 2 fails to specify the present position of the subject vehicle (S220: NO), the calculation processor 2 downloads relative data of all available radio receiving frequencies from the storage unit 5 by executing a command channel[ ]=setAllChannel( ). A radio receiving frequency fr at which a radio broadcast is transmitted is different from one area to another area. Thus, when the area is specified, the radio broadcast frequency is specified. Further, even when the area is failed to be specified cause of a failure of specifying the present position of the subject vehicle, the radiation noise is reduced by setting the sensing frequency fs such that the sensing frequency fs is not within a range of the available radio receiving frequencies fr of the radio stations 20.

Figure 7:
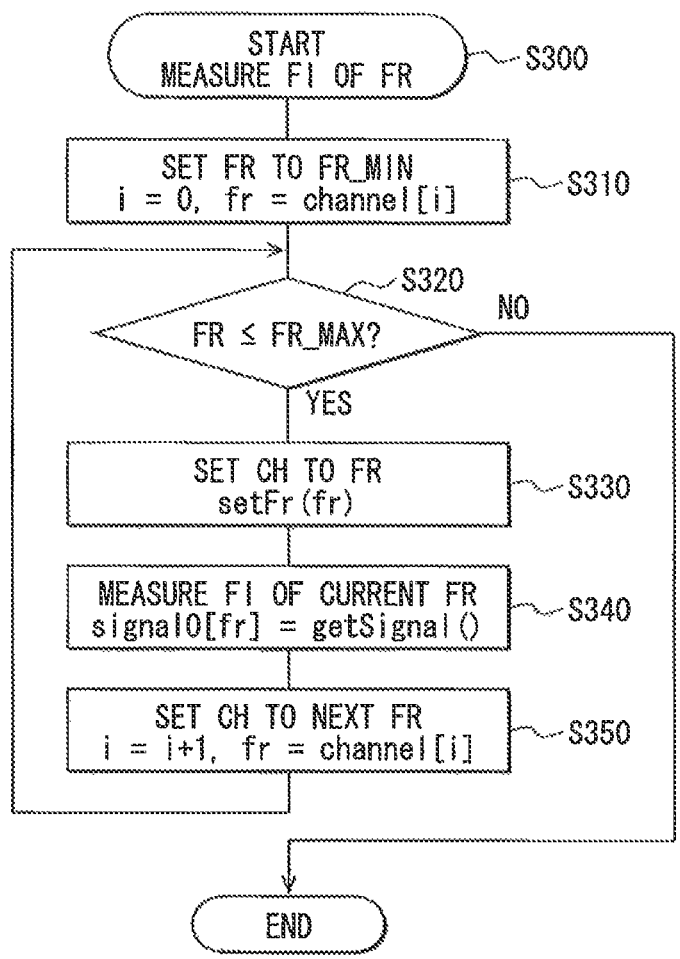
FIG. 7 is a flowchart showing a measuring process of a field intensity level of the radio receiving frequency according to the first embodiment.

At S300 of FIG. 5, the calculation processor 2 obtains a field intensity level of the radio receiving frequency fr by executing a command getsSignal( ). At S300, the calculation processor 2 obtains the field intensity level at each radio receiving frequency fr included in a radio frequency band during the non-operation state of the capacitance detection circuit 7. That is, at S300, the calculation processor 2 obtains the static field intensity level of each radio receiving frequency fr. FIG. 7 shows an example of obtaining the field intensity level of each radio receiving frequency fr in detail.

As shown in FIG. 7, at S310, the calculation processor 2 sets the radio receiving frequency fr to a minimum radio receiving frequency fr_min by executing commands i=0, fr=channel [i]. This is an initialization of the radio receiving frequency fr, which is set as the available radio receiving frequency fr at above-described setting process of the radio receiving frequency fr. Thus, the initial value of the radio receiving frequency fr is the minimum radio receiving frequency fr_min. Then, the calculation processor 2 controls the radio receiver 9 to scan the radio receiving frequencies fr from the minimum radio receiving frequency fr_min to a maximum radio receiving frequency fr_max. At S320, the calculation processor 2 compares each present radio receiving frequency fr with the maximum frequency fr_max by executing a command fr<=fr_max. When each present radio receiving frequency fr is smaller or equal to the maximum radio receiving frequency fr_max, at S330, the calculation processor 2 sets the radio receiving frequency fr by executing a command setFr(fr). At each radio receiving frequency fr, the radio receiver 9 measures the field intensity level of each radio receiving frequency fr using a built-in field intensity meter. The field intensity meter is also known as an S-meter. Then, the calculation processor 2 controls the radio receiver 9 to transmit the field intensity level of each radio receiving frequency fr to the calculation processor 2. Then, at S340, the calculation processor 2 stores the measured field intensity level of each radio receiving frequency fr to the storage unit 5 by executing a command signal0[fr]=getSignal( ). The field intensity levels of all of the radio receiving frequencies fr are stored into an array. Thus, in this case, the signal0[fr] indicates a one-dimensional array, which stores the field intensity levels of all of the radio receiving frequencies fr during the non-operation state of the capacitance detection circuit 7. Above-described processes are performed at a time of a startup of the control apparatus 1 before the capacitive sensor 11 is manipulated by the user. With above-described configuration, the calculation processor 2 measures the field intensity levels of all of the available radio receiving frequencies fr. In this case, since the detection of the electrostatic capacitance Cx is not performed, the field intensity levels of the available receiving frequencies fr are not affected by the switching noise generated in the switching unit 21.

At S110 of FIG. 5, the calculation processor 2 drives the capacitance detection circuit 7 to start the detection of the electrostatic capacitance Cx by executing a command startSense( ). When the detection of the electrostatic capacitance Cx starts, the charge switch SW1 and the discharge SW2 of the switching unit 21 are open and closed in the complementary manner so that the capacitor Cmod is repeatedly charged and discharged. When the switch SW1 and the discharge SW2 are open and closed in the complementary manner, the switching noise is generated in the switching unit 21. Hereinafter, the radiation noise is also referred to as a switching noise.

Figure 8:
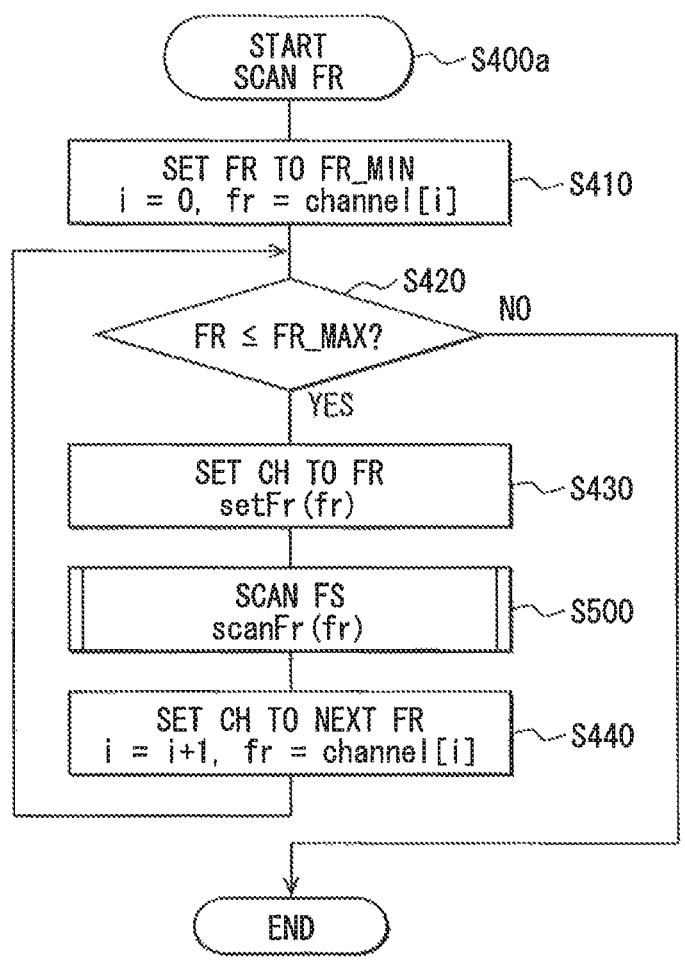
FIG. 8 is a flowchart showing a scanning process of the radio receiving frequency according to the first embodiment.

At S400a, the calculation processor 2 scans the receiving frequencies fr of the radio stations 20 by executing a command scanFr( ). FIG. 8 shows an example of scanning the receiving frequencies fr of the radio stations 20 in detail. As shown in FIG. 8, at S410, the calculation processor 2 initializes the radio receiving frequency fr to the minimum radio receiving frequency fr_min by executing commands i=0, fr=channel [i]. That is, at S410, the calculation processor 2 sets an initial value of the radio receiving frequency fr to the minimum radio receiving frequency fr_min.

Then, the calculation processor 2 controls the radio receiver 9 to scan the receiving frequencies fr from the minimum radio receiving frequency fr_min to the maximum radio receiving frequency fr_max. At S420, the calculation processor 2 compares each radio receiving frequency fr with the maximum frequency fr_max by executing a command fr<=fr_max. When each radio receiving frequency fr is smaller or equal to the maximum frequency fr_max, at S430, the calculation processor 2 sets the radio receiving frequency fr by executing a command setFr(fr). At S500, the calculation processor 2 performs a scanning process of the sensing frequency fs by executing a command scanFr(fr). Specifically, the calculation processor 2 changes a switching frequency of the switching unit 21 in the scanning process of the sensing frequency fs. That is, a switching frequency at which the charge switch SW1 is switched between an open state and a closed state and the discharge switch SW2 is switched between a closed state and an open state is changed by the calculation processor 2. With this configuration, the radiation noise generated in the switching unit 21 is detected.

Figure 9:
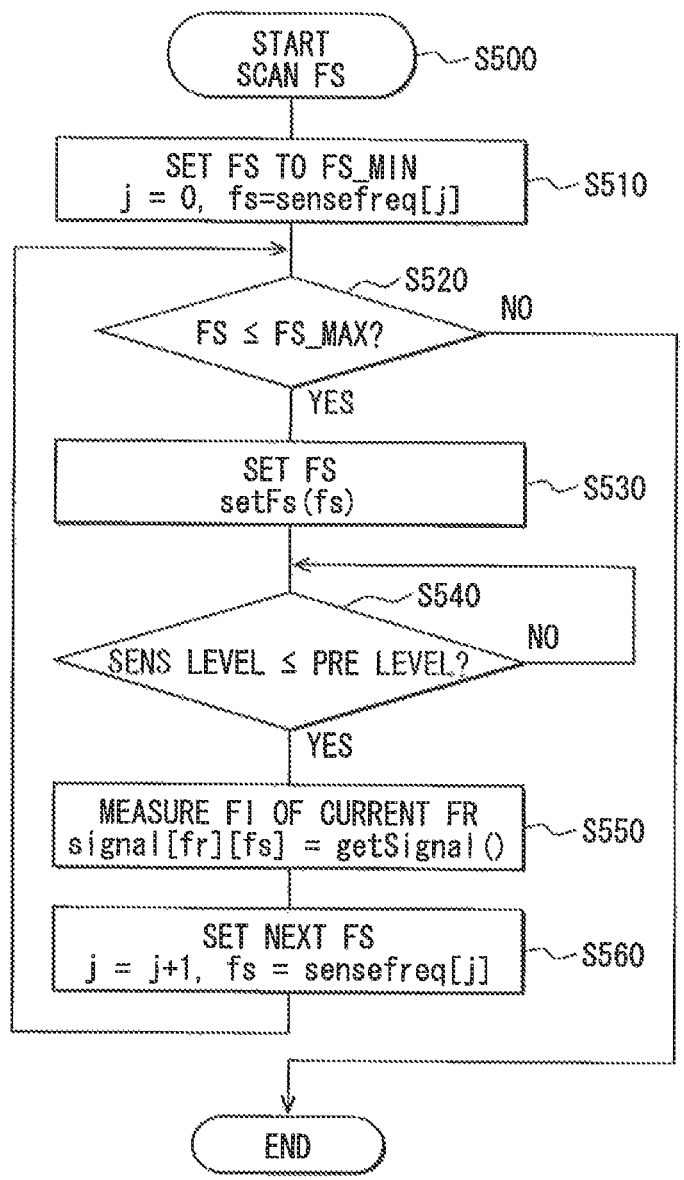
FIG. 9 is a flowchart showing a scanning process of a sensing frequency according to the first embodiment.

FIG. 9 shows an example of the scanning process of the sensing frequency fs. As shown in FIG. 9, at S510, the calculation processor 2 sets a candidate value of the sensing frequency fs to a minimum sensing frequency fs_min by executing commands j=0, fs=sensefreq[j]. When the sensing frequency fs is preliminarily set to have selectable sensing frequency values within a frequency range of 300 kHz to a 400 kHz, at S510, the sensing frequency fs is set to 300 kHz, which is the minimum value of the frequency range. Then, at S530 and S560, the calculation processor 2 increases the sensing frequency fs from the minimum frequency to a maximum frequency fr_max by a predetermined frequency increment. For example, when the sensing frequency fs is preliminarily set to have the selectable sensing frequency values within the frequency range of 300 kHz to a 400 kHz, the calculation processor 2 increases the sensing frequency fs from 300 kHz to 400 kHz by 10 kHz increments each time. Further, at S550, the calculation processor 2 measures a field intensity level of the present radio receiving frequency fr at each sensing frequency fs, and stores the measured field intensity levels of the present radio receiving frequency fr at each sensing frequency fs to the storage unit 5 by executing a command signal[fr][fs]=getSignal( ). Each of the field intensity levels signal[fr][fs] of the present radio receiving frequency fr at each sensing frequencies fs is measured under a corresponding sensing frequency fs and the present radio receiving frequency fr.

The scanning of the sensing frequencies fs is performed during the scanning of the radio receiving frequencies fr. Specifically, the scanning of the sensing frequencies fs is performed at each radio receiving frequency fr included in the radio receiving band or the radio receiving group. Thus, the field intensity levels stored in the signal[fr][fs] are depended on both the radio receiving frequencies fr and the sensing frequencies fs.

During the scanning of the sensing frequencies fs, the calculation processor 2 may further determine whether a sensing level of the capacitive sensor 11 is lower or equal to a predetermined level at S540, and only measures the field intensity level when the sensing level of the capacitive sensor 11 is lower or equal to the predetermined level. When the sensing level of the capacitive sensor 11 is lower or equal to the predetermined level, the finger 26 is in a non-approach state to the manipulation panel 25 or in a non-touch state on the manipulation panel 25

When the sensing level of the capacitive sensor 11 is higher than the predetermined level, the body of the user operates as an antenna of the radio circuit system. Thus, a current generated between sensitive electrodes of the capacitive sensor 11 increases, and a level of the noise increases. Thus, a measuring condition of the field intensity level is stabilized by determining whether the sensing level of the capacitive sensor 11 is lower or equal to the predetermined level at S540.

When the scanning process of the sensing frequency fs shown in FIG. 9 is ended, the field intensity levels of the present radio receiving frequency fr, which are measured at each sensing frequency fs during the switching operation of the switching unit 21, are obtained.

At S700a of FIG. 5, the calculation processor 2 performs a linking process of the sensing frequency fs to the radio receiving frequency fr by executing a command setTabFs( ). In the linking process of the sensing frequency fs, the calculation processor 2 determines a selected value of the sensing frequency from the selectable sensing frequency values so that a difference between the pre-operation value and the post-operation value of the field intensity level at the selected value of the sensing frequency has a minimum value. Hereinafter, the selected value of the sensing frequency is also referred to as a selected sensing frequency fss.

Specifically, when the difference between the pre-operation value and the post-operation value of the field intensity level is small at the selected sensing frequency fss, the calculation processor 2 determines that the selected sensing frequency fss scarcely affects the present radio receiving frequency fr. Thus, the calculation processor 2 sets the sensing frequency fs as the selected sensing frequency fss, which corresponds to the present radio receiving frequency fr.

Figure 10:
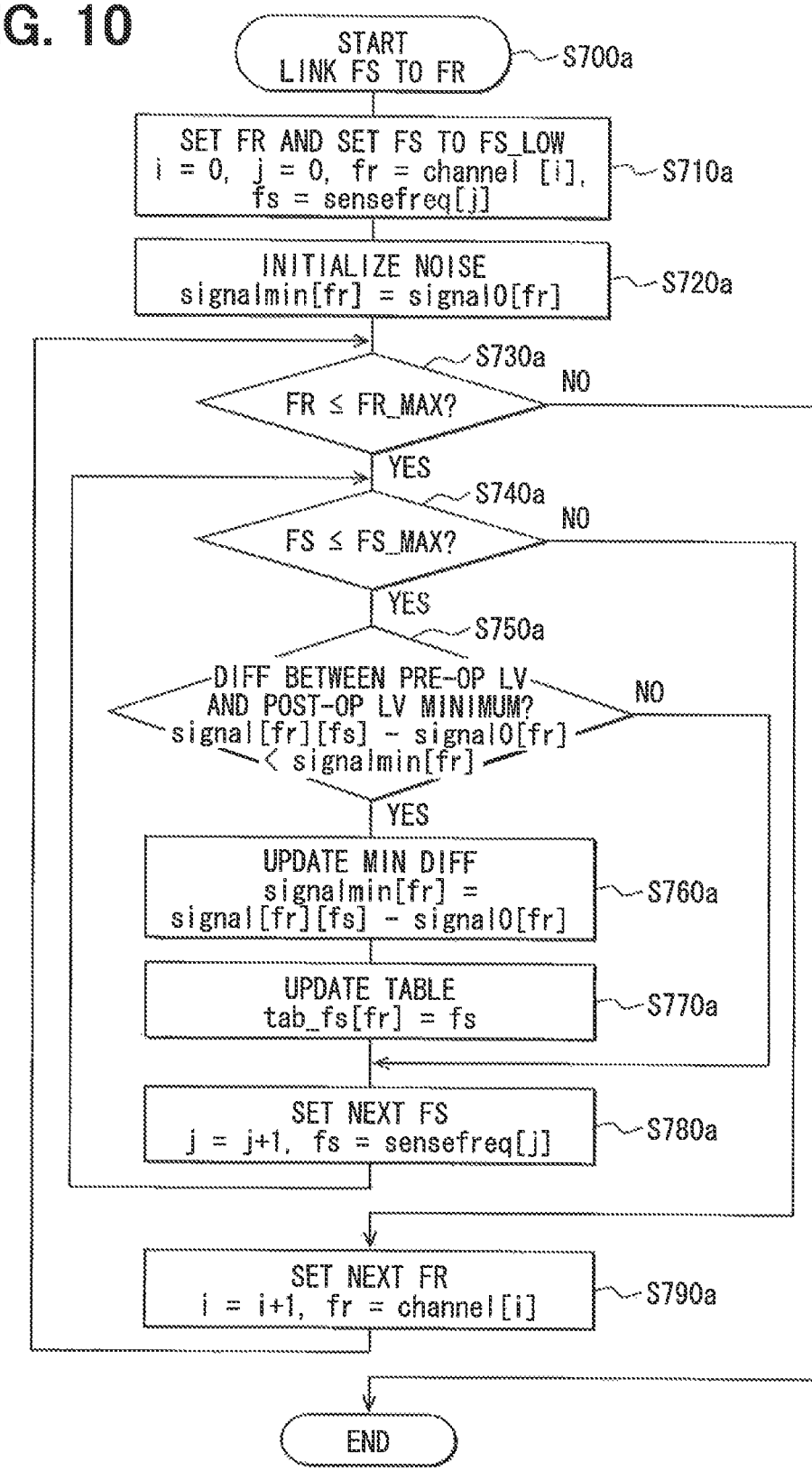
FIG. 10 is a flowchart showing a linking process of the sensing frequency according to the first embodiment.

In the linking process of the sensing frequency fs to the radio receiving frequency fr, the calculation processor 2 executes commands shown in FIG. 10. FIG. 10 shows an example of the linking process of the sensing frequency fs to the radio receiving frequency fr. At S710a, the calculation processor 2 sets the radio receiving frequency fr and the sensing frequency fs to lower frequency limits, respectively. Then, at S720a, the calculation processor 2 performs an initialization of an array sig_min[fr], which stores a minimum field intensity level of each radio receiving frequency fr. At first, the calculation processor 2 initializes the array sig_min [fr] so that the minimum field intensity levels of the radio receiving frequencies fr are set as the pre-operation field intensity levels. That is, the array sig_min[fr] is initialized by the as array signal0[fr], which stores pre-operation field intensity levels.

At S730a, S740a, S780a, S790a, the calculation processor 2 changes the radio receiving frequency fr and the sensing frequency fs from the respective minimum values to the respective maximum values. When the radio receiving frequency fr is fixed, at each value of the sensing frequency fs, the calculation processor 2 calculates a difference between the pre-operation value and the post-operation value of the field intensity level, and determines whether the difference is a minimum value at S750a. When the difference is the minimum value (S750a: YES), the calculation processor 2 updates the minimum value of the difference at S760a. Then, the calculation processor 2 stores the sensing frequency fs at which the difference between the pre-operation value and the post-operation value has the minimum value to a sensing frequency setting table tab_fs[fr] at S770a. The sensing frequency setting table tab_fs[fr] stores the sensing frequency fs at which the difference between the pre-operation value and the post-operation value of the field intensity level of the radio receiving frequency fr has the minimum value.

The calculation processor 2 updates the minimum value of the difference between the pre-operation value and the post-operation value of the field intensity level of the radio receiving frequency fr with respect to each radio receiving frequency fr. That is, the update process is repeatedly performed at each sensing frequency fs, and further is repeatedly perform at each radio receiving frequency fr as shown in S780a and S790a of FIG. 10. Thus, each selected sensing frequency fss with respect to the corresponding radio receiving frequency fr is determined.

With above-described configuration, after the linking process of the sensing frequency fs is ended, the selected sensing frequencies fss with respect to all of the radio receiving frequencies fr are determined. Thus, the sensing frequency fs is determined corresponding to each radio receiving frequency fr.

As described above, each selected sensing frequency fss, which generates a minimum switching noise to the corresponding radio receiving frequency fr, is linked to the corresponding radio receiving frequency fr. Thus, when a predetermined radio receiving frequency fr is selected by the user, the sensing frequency fs is set to the selected sensing frequency fss in above-described manner so that the switching noise is reduced.

In the control apparatus 1 according to the present embodiment, the sensing frequency fs of the capacitance detection circuit 7 is set corresponding to each radio receiving frequency fr of the radio receiver 9. Thus, an interference of the sensing frequency fs to the radio receiver 9 is reduced.

Further, the radio antenna 19 is used to measure the pre-operation value of the field intensity level of the radio receiving frequency fr and the post-operation value of the field intensity level of the radio receiving frequency fr. The sensing frequency fs is determined based on the difference between the pre-operation value and the post-operation value of the field intensity level. Thus, the selected sensing frequency fss at which the radio receiving frequency fr is scarcely affected by the switching operation of the switching unit 21 can be determined with above-described configuration. Thus, an adverse effect of the switching noise to the radio receiving frequency fr is reduced, and an interference of the switching noise to the radio receiver 9 is reduced.

When the radio receiving frequency fr of the radio receiver 9 is specified based on the present position information of the subject vehicle, the sensing frequency fs is determined corresponding to the radio receiving frequency fr. Thus, the radio noise, which is generated within a range of the available radio receiving frequencies fr at the present position, is reduced. Herein, the available radio receiving frequencies fr are also referred to as a receiving frequency band or a receiving frequency group. When the present position of the subject vehicle is used to specify the available radio receiving frequencies fr received from the radio stations 20, the radio receiving frequencies fr at which the interferences need to be reduced are specified. Thus, a processing time is reduced by using the present position of the subject vehicle to specify the available radio receiving frequencies fr.

Further, when the calculation processor 2 fails to specify the present position of the subject vehicle, the sensing frequency fs is set based on all of the available radio receiving frequencies fr in all of the areas. Thus, the radio noise is reduced at all of the available radio receiving frequencies fr in all of the areas.

Further, the sensing frequency fs is set corresponding to the radio receiving frequency fr of the radio receiver 9 under a condition that the approach of the finger 26 to the manipulation panel 25 or the touch of the finger 26 on the manipulation panel 25 is not detected by the capacitive sensor 11. With this configuration, the harmonic noise of the switching frequency is detected under a stabilized condition. That is, the harmonic noise of the switching frequency is not affected by other noise.

(Second Embodiment)

The following will describe a control apparatus 1 of a capacitive touch sensor according to a second embodiment of the present disclosure with reference to FIG. 11 to FIG. 14. In the control apparatus 1 according to the present embodiment, the calculation processor 2 measures a charge and discharge signal provided to the electrostatic capacitance Cx of the capacitive sensor 11. Then, the calculation processor 2 sets the sensing frequency fs with respect to each of the radio receiving frequencies fr included in the charge and discharge signal under a condition that the harmonic noise level generated within a range of the radio receiving frequencies fr is lower than a predetermined level. In the present embodiment, the same reference number is added to the same or equivalent parts in the drawings, a description of the equivalent part or the same part is omitted.

Figure 11:
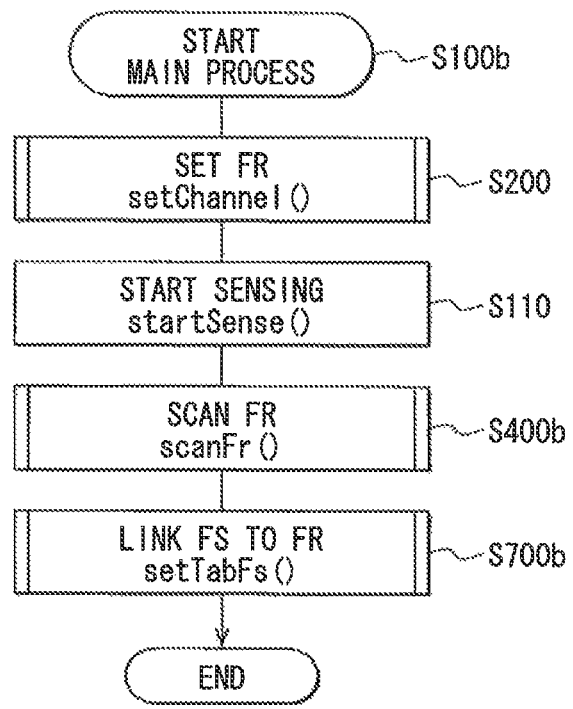
FIG. 11 is a flowchart showing a main process according to a second embodiment of the present disclosure.

FIG. 11 shows a flowchart of a main process executed by the calculation processor 2 of the control apparatus 1 according to the present embodiment. As shown in FIG. 11, the calculation processor 2 skips a measuring process of the field intensity level of the radio receiving frequency fr executed at S300 of FIG. 5. That is, the calculation processor 2 skips a measurement of the pre-operation value of the field intensity level of the radio receiving frequency fr. In the present embodiment, the calculation processor 2 drives the capacitance detection circuit 7 at S110 by executing a command startSense( ), performs a scanning process of the radio receiving frequencies fr at S400b by executing a command scanFr( ), and performs the linking process of the sensing frequency fs at S700b by executing a command setTabFs( ).

Figure 12:
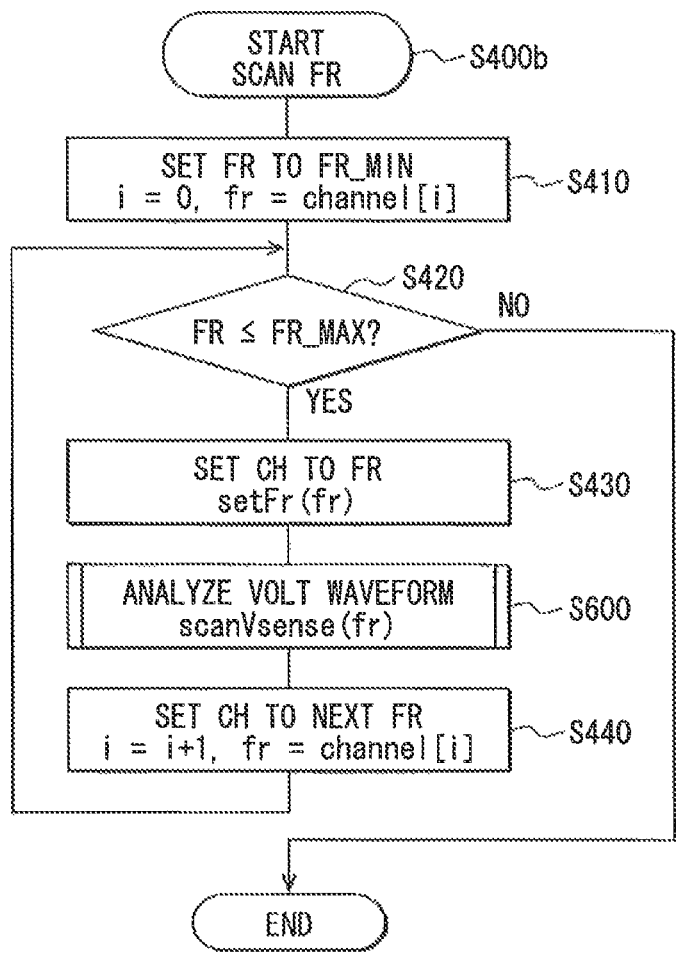
FIG. 12 is a flowchart showing a scanning process of a radio receiving frequency according to the second embodiment.

In the present embodiment, S400b and S700b are different from the foregoing embodiment. The following will mainly describe S400b and S700b. FIG. 12 shows a scanning process of the radio receiving frequencies fr at S400b. As shown in FIG. 12, at S410, the calculation processor 2 sets the radio receiving frequency fr to a minimum radio receiving frequency fr_min by executing commands i=0, fr=channel [i]. Then, the calculation processor 2 controls the radio receiver 9 to scan the radio receiving frequencies from the minimum radio receiving frequency fr_min to a maximum radio receiving frequency fr_max. At S430, the calculation processor 2 resets a next radio receiving frequency fr by executing a command setFr(fr). At S600, the calculation processor 2 performs an analysis process of a voltage waveform to the voltage Vsen by executing a command scanVsense(fr).

Figure 13:
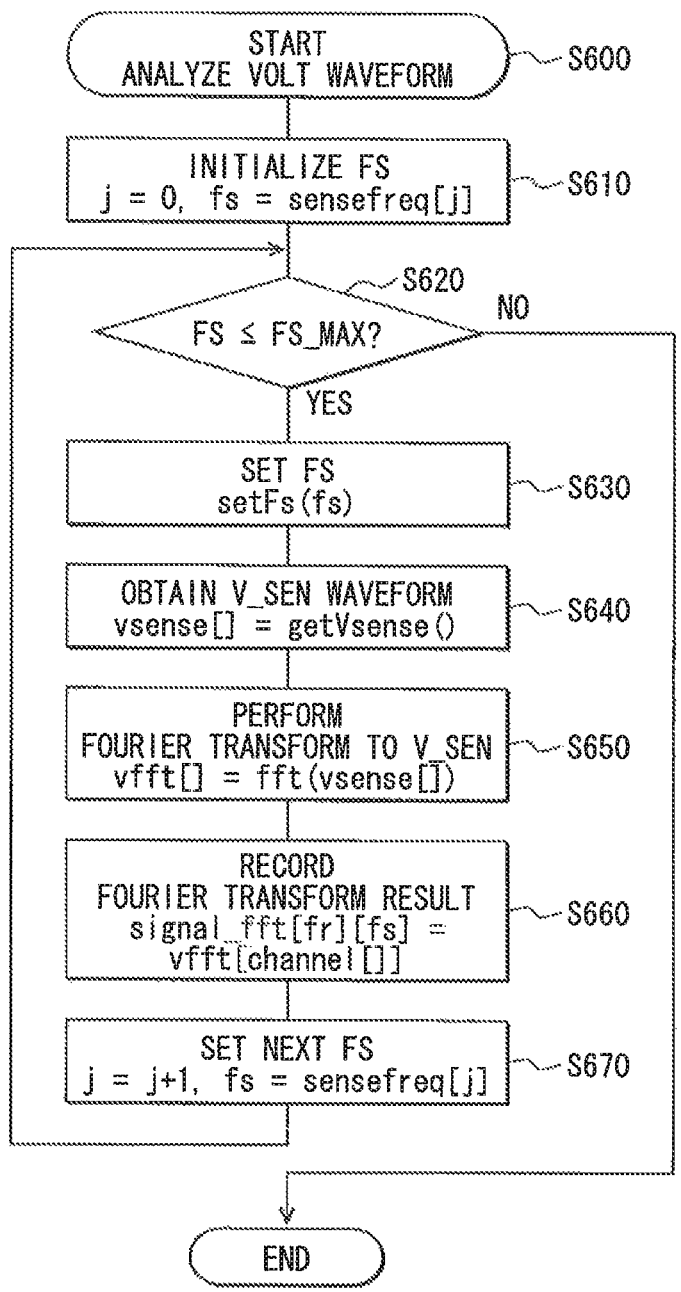
FIG. 13 is a flowchart showing an analysis process of a voltage waveform according to the second embodiment.

FIG. 13 shows the analysis process of the waveform of the voltage Vsen in detail. As shown in FIG. 13, the calculation processor 2 initializes the sensing frequency fs at S610 by executing commands j=0, fs=sensefreq[j]. Then, at S620, S630, S670, the calculation processor 2 changes the sensing frequency fs from the minimum value fs_min to the maximum value fs_max, and obtains the voltage waveform of the voltage Vsen at S640 by executing a command vsense[ ]=getVsense( ). Then, the calculation processor 2 performs a Fourier transform of the voltage Vsen at S650 by executing a command vfft[ ]=fft (vsense[ ]). After the Fourier transform based on the present radio receiving frequencies fr, the calculation processor 2 stores a Fourier transform result to a Fourier result table signal_fft[fr][fs] at S660 by executing a command signal_fft[fr][fs]=vfft[channel[ ]]. The Fourier transform result includes, for example, frequencies, a peak value, an even energy within a predetermined range with the present radio receiving frequency fr as a center frequency. The Fourier result table signal_fft[fr][fs] indicates signal levels of the Fourier result of the voltage Vsen at each sensing frequency fs and at the present radio receiving frequency fr.

A switching noise of the charge and the discharge signal at the capacitor Cmod appears as an integral-multiple harmonic noise of the sensing frequency fs. Thus, by performing the Fourier transform of the voltage Vsen, the harmonic noises of the sensing frequency fs can be analyzed, and an analysis result can be stored.

Further, in the present embodiment, during the analysis of the voltage waveform of the voltage Vsen at S600, the calculation processor 2 may further determine whether the sensing level of the capacitive sensor 11 is lower or equal to the predetermined level, and only obtains the voltage waveform of the voltage Vsen only when the sensing level of the capacitive sensor 11 is lower or equal to the predetermined level. When the sensing level of the capacitive sensor 11 is higher than the predetermined level, the body of the user operates as an antenna of the radio circuit system. Thus, a current generated between sensitive electrodes of the capacitive sensor 11 increases, and a level of the noise increases. Thus, a measuring condition of the voltage waveform of the voltage Vsen is stabilized by determining whether the sensing level of the capacitive sensor 11 is lower or equal to the predetermined level.

Figure 14:
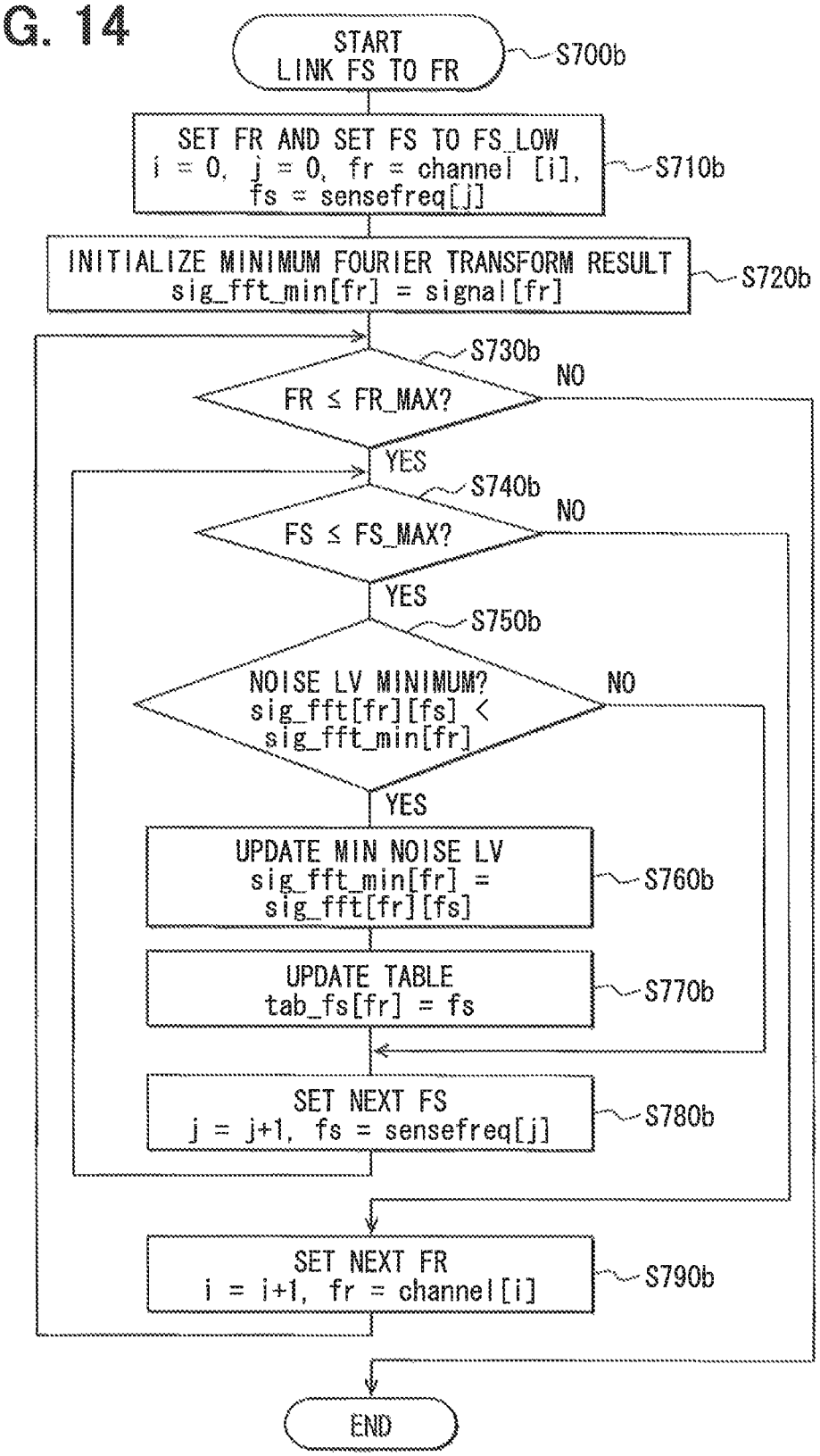
FIG. 14 is a flowchart showing a linking process of a sensing frequency according to the second embodiment.

FIG. 14 shows an example of the linking process of the sensing frequency fs. At S710b, the calculation processor 2 sets the radio receiving frequency fr and the sensing frequency fs to lower frequencies limits, respectively by executing commands i=0, j=0, fr=channel[i], fs=sensefreq[j]. Then, at S720b, the calculation processor 2 performs an initialization of an array sig_fft_min[fr]=signal[fr], which stores a minimum value of the Fourier result at each sensing frequency fs when the radio receiving frequency fr is fixed. Then, at S730b, S740b, S780b, S790b, the calculation processor 2 changes the radio receiving frequency fr and the sensing frequency fs from the respective minimum values to the respective maximum values. At each value of the sensing frequency fs, the calculation processor 2 determines whether the noise level has a minimum value at S750b by executing a command sig_fft[fr][fs]<sig_fft_min[fr], and updates the minimum value of the noise level at S760 by executing a command sig_fft_min[fr]=sig_fft[fr][fs]. When the minimum value of the noise level is updated, the calculation processor 2 updates the sensing frequency fs stored in the tab_fs[fr]=fs. The sensing frequency fs corresponding to the minimum value of the noise level is also referred to as a selected sensing frequency fss.

In the present embodiment, when the capacitance detection circuit 7 operates at the sensing frequency fs, the switching noise generated within a range of the radio receiving frequencies fr is determined based on the Fourier transform result of the voltage Vsen. This process is performed to each combination of the radio receiving frequency fr and the sensing frequency fs. At a fixed radio receiving frequency fr, when the noise level of the harmonic noises has the minimum value at one of the sensing frequencies fs, the one of the sensing frequencies fs is set as the selected sensing frequency fs of the corresponding radio receiving frequency fr.

With above-described configuration, after the linking process of the sensing frequency fs at S700b is ended, the selected sensing frequency fss at which the switching noise of the sensing frequency fs corresponding radio receiving frequency fr has the minimum value is determined. Thus, the sensing frequency fs is determined corresponding to each radio receiving frequency fr.

With above-described configuration, the selected sensing frequency fss at which the switching noise of the corresponding radio receiving frequency fr has the minimum value is linked to the corresponding radio receiving frequency fr. Thus, when a predetermined radio receiving frequency fr is selected by the user, the sensing frequency fs is set in above-described manner so that the switching noise is reduced.

In the control apparatus 1 according to the present embodiment, an interference of the switching noise to the radio receiver 9 is reduced by setting the selected sensing frequency fs at which the noise level of the harmonic noises at each radio receiving frequency fr included in the charge and discharge signal has the minimum value. Further, the noise level of the harmonic noises may have the minimum value at one or more sensing frequencies fs. In this case, one of the sensing frequency fs at which the noise level of the harmonic noises is lower than a predetermined value may be set as the selected sensing frequency fss.

As described above, the configuration of the control apparatus 1 according to the present embodiment is able to be applied to a control apparatus in which the spread-spectrum technique cannot be applied, an effect of the spread-spectrum technique is not sufficient, or a noise reduction effect of the spread-spectrum technique is not achieved cause of an increase in the harmonic noises.

(Third Embodiment)

The following will describe a control apparatus 1 of a capacitive sensor 11 according to a third embodiment of the present disclosure. In the control apparatus 1 according to the present embodiment, the calculation processor 2 stores a predetermined value of the sensing frequency fs. The predetermined value of the sensing frequency fs is set corresponding to the radio receiving frequency fr of the radio receiver 9.

The storage unit 5 stores the predetermined value of the sensing frequency fs of the corresponding radio receiving frequency fr of the radio receiver 9. In this case, the predetermined value of the sensing frequency fs is a frequency preliminarily determined during a production step corresponding to the available radio receiving frequencies fr in all of the areas or corresponding to the available radio receiving frequencies fr in a corresponding area.

During the production step of the control apparatus 1, the switching noise that affects the radio receiving frequencies fr is detected, and the predetermined value of the sensing frequency fs is determined so that the switching noise has a minimum value or has a properly low value at the predetermined value of the sensing frequency fs. Then, the predetermined value of the sensing frequency fs is stored in the storage unit 5. In this case, the sensing frequencies fs may be respectively determined corresponding to the available radio receiving frequencies fr within the whole country or within each area. Further, only one sensing frequency fs may be determined corresponding to the available radio receiving frequencies fr within the whole country or within each area.

When the user selects one radio channel, the calculation processor 2 transmits a signal to the radio receiver 9 to indicate that the radio channel is selected by the user. The radio receiver 9 selects a corresponding radio channel based on the selection by the user, and notifies the calculation processor 2 that the selection of the channel is ended. Then, the calculation processor 2 sets the sensing frequency fs to have the predetermined value that is stored in the storage unit 5. With this configuration, the adverse affect of the switching noise to the radio receiving frequencies fr is reduced, and an interference to the radio receiver 9 is reduced.

(Fourth Embodiment)

FIG. 15 shows an example of radio channels and time slots of the radio channels selected by the user relative to a control apparatus 1 according to a fourth embodiment of the present disclosure. In the control apparatus 1 of the present embodiment, the sensing frequency fs is set corresponding to a radio receiving frequency fr of a radio channel selected by the user and a time slot of the selected radio receiving frequency fr. Further, in the present embodiment, the sensing frequency fs may also be set corresponding to the radio receiving frequency fr selected by each individual user and the time slot of the selected radio receiving frequency fr. Herein, the time slot indicates that the selected radio receiving frequency fr is maintained in a selected state during the time slot. In the present embodiment, the same reference number is added to the same or equivalent parts in the drawings, a description of the equivalent part or the same part is omitted.

FIG. 15 shows an example of storage data stored in a radio channel database. The storage unit 5 may also operate as a channel storage unit 5 that accumulates learning data relative to the radio channel selection by the user in order to learn a habit of a radio channel selection of the user.

For example, when a first user usually listens to a radio channel B (CH B), at least three times in a month, during a time slot from six am to six thirty am from Monday to Wednesday, the calculation processor 2 stores the selected radio channel B and the time slot of the selected radio channel B in the storage unit 5 as a database. After six thirty, the first user usually listens to, for example, a radio channel A (CH A) during a time slot from six thirty am to seven thirty am on Monday and Tuesday. Similarly, the calculation processor 2 stores the selected radio channel A and the time slot of the selected radio channel A in the storage unit 5 as a database.

Similarly, when a second user usually listens to a radio channel C (CH C) during a time slot from seven pm to eight pm from Monday to Saturday, the calculation processor 2 stores the selected radio channel C and the time slot of the selected radio channel C in the storage unit 5 as a database. As described above, the storage unit 5 accumulates the learning data relative to the radio channel selection and time slot selection by the user in order to learn the habit of the radio channel selection of each user.

During the time slots stored in the storage unit 5, the calculation processor 2 determines that one of the radio channels A, B, C stored in the storage unit 5 are highly possible to be selected by the user based on the habit of the radio channel selection of each user. Thus, the calculation processor 2 sets the sensing frequency fs to the selected value corresponding to the radio receiving frequency fr of the one of the radio channels A, B, C. A method of determining the selected value of the sensing frequency fs is similar to the foregoing embodiments.

In the control apparatus 1 according to the present embodiment, the sensing frequency fs is set corresponding to the radio receiving frequency fr of the selected radio channel and the time slot of the selected radio channel. Thus, the calculation processor 2 learns the habit of the radio channel selection of the based on each time slot. Further, the calculation processor 2 sets the sensing frequency fs so that the sensing frequency fs is properly set for the user based on the habit of selecting the radio channel.

Further, the storage unit 5 may prepare a database for each user to store the habit of the radio channel selection of each user. In this case, the calculation processor 2 may specify each user based on a private information that is input to the manipulation unit 3. With above-described configuration, the calculation processor 2 can set the sensing frequency fs corresponding to the radio receiving frequency fr and the time slot of the selected radio channel that is selected by each user. Thus, the sensing frequency fs is properly set for each individual user.

In the present disclosure, the calculation processor 2 may also operate as a setting unit, a charge control unit, a second measuring unit, a specifying unit and a selection unit. The radio receiver 9 may also operate as a first measuring unit that measures a field intensity level of a radio receiving frequency fr.

(Other Embodiments)

In the present embodiment, the radio antenna 19 is used to measure the field intensity level of the radio receiving frequency fr. Further, a pattern antenna arranged near to the capacitive sensor 11 may be used to measure the field intensity level of the radio receiving frequency fr. In the present embodiment, the sensing frequency fs is set under a condition that the capacitance detection circuit 7 detects that the manipulation panel 25 is in the non-approach state or in the non-touch state. Further, the non-approach state or in the non-touch state of the manipulation panel 25 may be detected in another manner other than the detection by the capacitance detection circuit 7.

The control apparatus 1 may be applied to an in-vehicle display apparatus, an in-vehicle audio apparatus and the like.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A control apparatus of a capacitive touch sensor comprising:
   a capacitive sensor;
   a radio receiver that receives a radio broadcast at a radio receiving frequency;
   a setting unit that sets a sensing frequency corresponding to the radio receiving frequency of the radio receiver;
   a charge control unit that controls a switching unit to perform a switching operation at the sensing frequency set by the setting unit in order to charge and discharge an electrostatic capacitance generated at the capacitive sensor; and
   a first measuring unit that measures a field intensity level before the charge control unit controls the switching unit to perform the switching operation and measures a field intensity level after the charge control unit controls the switching unit to perform the switching operation, wherein
   the capacitive sensor detects an approach manipulation to a manipulation panel or a touch manipulation on the manipulation panel, and
   the setting unit sets the sensing frequency corresponding to a difference between the field intensity level measured before the switching operation by the first measuring unit and the field intensity level measured after the switching operation by the first measuring unit.

2. The control apparatus according to claim 1, further comprising:
   a specifying unit that specifies the radio receiving frequency of the radio receiver corresponding to present position information,
   wherein the setting unit sets the sensing frequency corresponding to the radio receiving frequency specified by the specifying unit.

3. The control apparatus according to claim 1, further comprising:
a selection unit that selects all of the radio receiving frequencies that are available,
wherein the setting unit sets the sensing frequency corresponding to each of the radio receiving frequencies selected by the selection unit.

4. The control apparatus according to claim 1,
wherein the setting unit sets the sensing frequency corresponding to the radio receiving frequency of the radio receiver under a condition that the approach manipulation or the touch manipulation is not detected by the capacitive sensor.

5. The control apparatus according to claim 1, further comprising:
a channel storage unit that stores a radio receiving frequency selected by the user and a time slot of the radio receiving frequency,
wherein the setting unit sets the sensing frequency corresponding to the radio receiving frequency and the time slot, which are stored in the channel storage unit.

6. The control apparatus according to claim 5, wherein
the channel storage unit stores the radio receiving frequency and the time slot for each individual user, and
the setting unit sets the sensing frequency corresponding to the radio receiving frequency and the time slot, which are stored for each individual user.

7. A control apparatus of a capacitive touch sensor comprising:
a capacitive sensor;
a radio receiver that receives a radio broadcast at a radio receiving frequency;
a setting unit that sets a sensing frequency corresponding to the radio receiving frequency of the radio receiver;
a charge control unit that controls a switching unit to perform a switching operation at the sensing frequency set by the setting unit in order to charge and discharge an electrostatic capacitance generated at the capacitive sensor; and
a measuring unit that controls the switching unit to perform the switching operation at respective switching frequencies that vary within a predetermined range and measures respective charge and discharge signals, each of which charges or discharges the electrostatic capacitance generated at the capacitive sensor, wherein
the capacitive sensor detects an approach manipulation to a manipulation panel or a touch manipulation on the manipulation panel, and
the setting unit sets the sensing frequency equal to the switching frequency under a condition that the charge and discharge signal measured by the second measuring unit and corresponding to the switching frequency has a high-frequency noise level lower than a predetermined level within a frequency band of the radio receiving frequency.

8. A control apparatus of a capacitive touch sensor comprising:
a capacitive sensor;
a radio receiver that receives a radio broadcast at a radio receiving frequency;
a setting unit that sets a sensing frequency corresponding to the radio receiving frequency of the radio receiver;
a charge control unit that controls a switching unit to perform a switching operation at the sensing frequency set by the setting unit in order to charge and discharge an electrostatic capacitance generated at the capacitive sensor; and
a storage unit that stores a predetermined sensing frequency set corresponding to the radio receiving frequency of the radio receiver, wherein
the capacitive sensor detects an approach manipulation to a manipulation panel or a touch manipulation on the manipulation panel, and
the setting unit sets the sensing frequency equal to the predetermined sensing frequency stored in the storage unit.

9. A control apparatus of a capacitive touch sensor comprising:
a capacitive sensor;
a radio receiver that receives a radio broadcast at a radio receiving frequency;
a setting unit that sets a sensing frequency corresponding to the radio receiving frequency of the radio receiver;
a charge control unit that controls a switching unit to perform a switching operation at the sensing frequency set by the setting unit in order to charge and discharge an electrostatic capacitance generated at the capacitive sensor; and
a specifying unit that specifies the radio receiving frequency of the radio receiver corresponding to present position information, wherein
the capacitive sensor detects an approach manipulation to a manipulation panel or a touch manipulation on the manipulation panel, and
the setting unit sets the sensing frequency corresponding to the radio receiving frequency specified by the specifying unit.

10. A control apparatus of a capacitive touch sensor comprising:
a capacitive sensor;
a radio receiver that receives a radio broadcast at a radio receiving frequency;
a setting unit that sets a sensing frequency corresponding to the radio receiving frequency of the radio receiver;
a charge control unit that controls a switching unit to perform a switching operation at the sensing frequency set by the setting unit in order to charge and discharge an electrostatic capacitance generated at the capacitive sensor; and
a channel storage unit that stores a radio receiving frequency selected by the user and a time slot of the radio receiving frequency, wherein
the capacitive sensor detects an approach manipulation to a manipulation panel or a touch manipulation on the manipulation panel, and
the setting unit sets the sensing frequency corresponding to the radio receiving frequency and the time slot, which are stored in the channel storage unit.

11. The control apparatus of the capacitive touch sensor in claim 10, wherein
the channel storage unit stores the radio receiving frequency and the time slot for each individual user, and
the setting unit sets the sensing frequency corresponding to the radio receiving frequency and the time slot, which are stored for each individual user.

* * * * *